United States Patent
Foley et al.

(10) Patent No.: US 9,052,984 B2
(45) Date of Patent: Jun. 9, 2015

(54) EXCEPTION DECLARATION REFACTORING TO REDUCE MEMORY FOOTPRINT

(75) Inventors: Sean C. Foley, Ottawa (CA); Berthold M. Lebert, Phoenix, AZ (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 1410 days.

(21) Appl. No.: 12/393,336

(22) Filed: Feb. 26, 2009

(65) Prior Publication Data

US 2010/0218175 A1  Aug. 26, 2010

(51) Int. Cl.
G06F 9/45 (2006.01)
G06F 9/44 (2006.01)
G06F 17/50 (2006.01)

(52) U.S. Cl.
CPC .............. *G06F 8/72* (2013.01); *G06F 17/5031* (2013.01); *G06F 8/443* (2013.01); *G06F 8/4434* (2013.01)

(58) Field of Classification Search
CPC .................................. G06F 8/72; G06F 8/443
USPC .......................................................... 717/151
See application file for complete search history.

(56) References Cited

U.S. PATENT DOCUMENTS

| | | | |
|---|---|---|---|
| 6,363,522 B1 * | 3/2002 | Click et al. | 717/160 |
| 6,412,109 B1 * | 6/2002 | Ghosh | 717/155 |
| 6,634,023 B1 * | 10/2003 | Komatsu et al. | 717/159 |
| 7,103,882 B2 * | 9/2006 | Kawahito | 717/151 |
| 2004/0210861 A1 * | 10/2004 | Kucukcakar et al. | 716/6 |
| 2008/0016507 A1 * | 1/2008 | Thomas et al. | 718/100 |

OTHER PUBLICATIONS

"Removing Redundancy via Exception Check Motion", by Sundaresan et al., Proceedings of the 6th annual IEEE/ACM international symposium on Code generation and optimization, Apr. 2008, CGO '08, pp. 134-143.*
Jinglig Xue et al., "A Fresh Look at Partial Redundancy Elimination as a Maximum Flow Problem (Abstract)" 15th Interanational Conference on Compiler Construction (CC 2006) Vienna Austria Mar. 30-31, 2006.*
Bernhard Scholz et al. "Predicated Partial Redundancy Elimination using Cost Analysis," Parallel Processing Letters, World Scientific Publishing Company, 2003.*
E. Morel et al. "Global Optimization by Suppression of Partial Redundancies" Communications of the ACM, Feb. 1979, vol. 22, No. 1.*

* cited by examiner

*Primary Examiner* — Wei Zhen
*Assistant Examiner* — Mohammed Huda
(74) *Attorney, Agent, or Firm* — Grasso PLLC; Fred Grasso

(57) ABSTRACT

A system, method and program product for optimizing compiled Java code to reduce file size. A system is provided that includes: a first optimization that removes unnecessary exception declarations in the compiled Java code; a second optimization that converts checked exception declarations to unchecked exception declarations in the compiled Java code; and a third optimization that removes exception lists in the compiled Java code.

17 Claims, 3 Drawing Sheets

EXCEPTION DECLARATION REFACTORING TO REDUCE MEMORY FOOTPRINT

FIELD OF THE INVENTION

This disclosure relates to optimizing compiled object oriented code, and more particularly to a system and method of refactoring exception declarations in compiled Java code to reduce the memory footprint of the code.

BACKGROUND OF THE INVENTION

As programmable computer processing finds its way into more and more devices, such as handheld devices, smart appliances, embedded systems, etc., efficient use of computing resources becomes more and more important. One such critical resource is memory, which must store the computer programs that control the device. Unfortunately, many computer programs, particularly those written in object oriented languages, tend to sacrifice program size for other efficiencies. While such efficiencies allow program source code to be written and implemented much quicker, the compiled program may include constructs that increase its size without providing any actual function at runtime. Accordingly, a need exists for optimization techniques that can reduce the program size of compiled object oriented programs.

SUMMARY OF THE INVENTION

The invention addresses the above-mentioned problems by shortening or eliminating exception lists that accompany method definitions in compiled Java class files. The invention provides various alternatives to accomplish this goal, all of which are an automated procedure performed by an optimization tool after development of the software program or library has completed, but prior to deployment of the application on a platform or device, in order to reduce memory usage on the platform file system. Therefore, the changes would be essentially invisible to the developer and to the user of the software, but would achieve savings in the deployment of the software.

In one embodiment, there is a system for optimizing compiled Java code to reduce file size, comprising: a computing device that comprises: a first optimization that removes unnecessary exception declarations in the compiled Java code; a second optimization that converts checked exception declarations to unchecked exception declarations in the compiled Java code; and a third optimization that removes exception lists in the compiled Java code.

In a second embodiment, there is a computer readable medium having a program product stored thereon for optimizing compiled Java code to reduce file size, comprising: program code that removes unnecessary exception declarations in the compiled Java code; program code that converts checked exception declarations to unchecked exception declarations in the compiled Java code; and program code that removes exception lists in the compiled Java code.

In a third embodiment, there is a computer readable medium having a program product stored thereon for optimizing compiled Java code to reduce file size, comprising: program code that removes unnecessary exception declarations in the compiled Java code; program code that converts checked exception declarations to unchecked exception declarations in the compiled Java code; and program code that removes exception lists in the compiled Java code.

One or more of the described optimizations are performed on compiled software after development is complete, and before deployment of the software. The invention is performed automatically by a tool that transforms the compiled software to achieve the benefits of compression. The user of the software would notice no difference in the behavior of the running programs.

The illustrative aspects of the present invention are designed to solve the problems herein described and other problems not discussed.

BRIEF DESCRIPTION OF THE DRAWINGS

These and other features of this invention will be more readily understood from the following detailed description of the various aspects of the invention taken in conjunction with the accompanying drawings.

Figure 1:
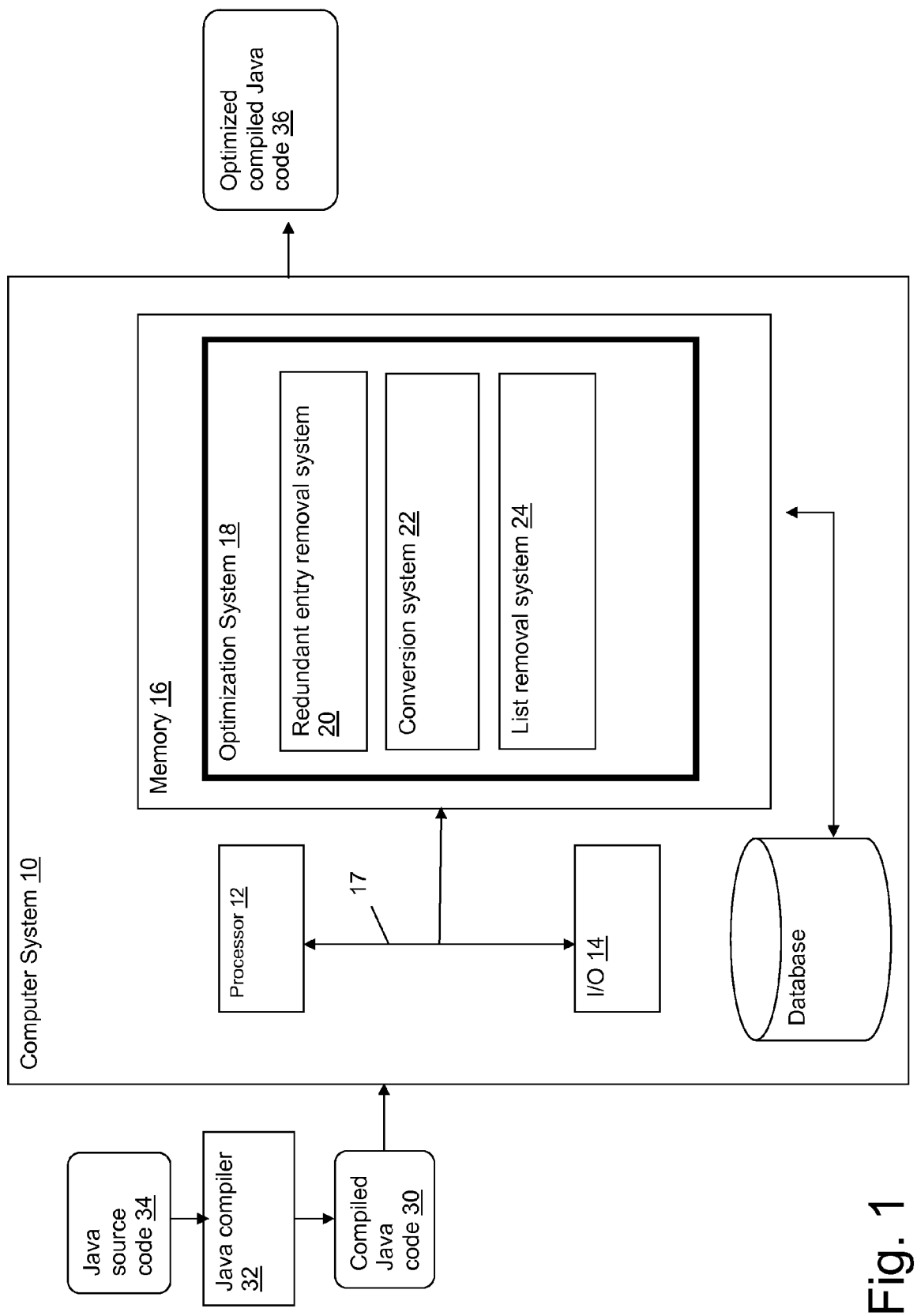
FIG. 1 depicts a computer system having an optimization system in accordance with an embodiment of the present invention.

The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION OF THE INVENTION

1. Checked and Unchecked Exceptions

An object oriented program consists of classes, each which contain methods (or functional members, or functions) that contain the instructions to run the program. Classes also contain data members (fields). Classes are "instantiated" in order to create objects. Each object contains its own set of data as specified by the data members of the class, and the functional members of any given object are capable of acting on the data members of the object.

Some languages allow for the "throwing" of objects, in which the execution stack of invoked methods is unwound due to an exceptional condition, until code that is capable of handling the exceptional condition is located. When a programmer chooses to throw an exception at a point in the code at which an exceptional condition has been detected in a given method, the programmer may choose either a "checked" exception or an "unchecked" exception. A "checked" exception is an exception for which callers of the method must choose to take an action for that exceptional condition, either by handling the condition, or by allowing it to propagate further down the stack of invoked methods. An "unchecked" exception does not force the programmer to make such a decision. The choices are the same in both cases, but a programmer need not even be aware of the possible unchecked exceptions that may result from a given method invocation.

Checked exceptions tend to be exceptional conditions that are detectable only at runtime, and can occur due to conditions beyond the control of the software itself, but can (and should) be handled gracefully because they are not so severe that they represent a severe problem to the software. Unchecked exceptions tend to be exceptions that arise because of errors in the software itself, or exceptional cases that are so severe that handling the exception is not generally recommended. Unchecked exceptions tend to be unpredictable, while checked exceptions are circumstances which are predictable and thus should be handled.

When an exception throws checked exceptions, there must be a facility in the programming language that alerts the callers of the method so that the programmer makes the required choice for handling the exception. Typically this is achieved by adding a list of checked exceptions to the method's signature.

This is how it is done in Java. In the Java programming language, only those objects whose classes are a subclass of java.lang.Throwable can be used as exception objects. The class type of the exception object determines where an exception can be caught and handled. Unchecked objects are those exceptions which are subclasses of java.lang.Error (exceptional circumstances so severe that they should not be caught) or java.lang.RuntimeException (exceptional circumstances which are largely the result of bugs, programming errors or other unpredictable circumstances). In Java, the class file is the structure which maintains the definition of a class and its members prior to runtime. Each method in the class file maintains of list of checked exceptions. These lists consume file space. The amount of memory consumed can add up with a large number of classes and methods.

On some platforms, memory usage must be kept to a minimum, particularly in embedded and mobile device platforms. Small differences in memory requirements make a huge difference in cost savings in relation to the cost of the device. One way to reduce memory usage is to shorten or eliminate these exception lists in the class file. Ultimately, this would have no effect on the program. In fact, these lists are not used by the Java virtual machine at runtime, they are used by the Java compiler at compile time, for compilers and other tools to be aware of the checked exceptions for a method invocation to instruct the user to add appropriate exception handling.

2. Exception Declaration Refactoring

As noted, the present invention reduces the memory footprint of a compiled program by shortening or eliminating exception lists (referred to herein as "exception declaration refactoring") that accompany method definitions in compiled Java class files. Various embodiments are described herein to accomplish this goal, all of which can be implemented with an optimization tool after the program or library has written and compiled, but prior to deployment of the application on a platform or device.

FIG. 1 depicts a computer system 10 having an optimization system 18 for performing exception declaration refactoring on an input comprising compiled Java code 30 to generate optimized compiled Java code 36. Compiled Java source code 30 is typically generated by a Java compiler 32, which is configured for compiling Java source code 34.

In this illustrative embodiment, optimization system 18 is implemented separately from the Java compiler 32, however, it is understood that the optimization system 18 could be integrated into the Java compiler 32. In addition, although this illustrative embodiment is described with reference to a Java environment, the invention could be applied and implemented for any type of object oriented environment in which lists of checked and unchecked exceptions are utilized in compiled class files.

Optimization system 18, which may for instance be implemented as a computer program product (i.e., a software program) that can be executed by processor 12 on computer system 10, provides three types of optimizations. These include: (1) a redundant entry removal system 20 for removing redundant entries in the list of checked exceptions; (2) a conversion system 22 for converting checked exceptions to unchecked exceptions; and (3) a list removal system 24 for entirely removing the lists of checked and unchecked exceptions. Any of these optimizations may be included in the optimization system 18, and one or more may be activated, e.g., by selecting a switch or parameter that directs the optimization system 18 to perform a particular type of optimization.

Entry Removal

Redundant entry removal system 20 removes unnecessary exception declarations for cases in which there are redundant entries in the lists found in each compiled class file. Redundant entries may include multiple copies of an exception in a single list and exception types that are a subtype of another exception in the list. In the latter case, the parent class exception handling is required, and by adding the handling for the parent class, that in turn automatically will act as handling for any subclass, and therefore the subclasses need not be listed in the exception list.

In addition, if an exception in the list is not a checked exception, then no handling for the exception is required and thus it need not be in the list. The following is an example of an unchecked exception that can be removed:

```
public void run( ) throws NullPointerException {
throw new NullPointerException( );
}
public void run( ) {
throw new NullPointerException( );
}
```

The difference in the compiled class file is 23 bytes. But if the declared runtime exception is not directly thrown in the method and it is not referenced anywhere else in the class then the difference increases to 59 bytes, because there is no longer any symbolic reference to the class NullPointerException in the class file.

```
public void run( ) throws NullPointerException { }
public void run( ) { }
```

Pseudo code for removing unnecessary checked exception declarations for cases in which there are redundant entries in the lists is as follows:

```
for each class
    for each method in class
        get exception list
        for each exception in list
            if runtime exception or error then discard
            else if subtype of previous exception in list then discard
        end for
    end for
end for
```

Experimental results for an illustrative instance messaging software application showed that there were almost 4,000 instances of Errors and RuntimeExceptions declared in the throws clause of the method signatures. In other programs, it is not unusual to find more than 10,000.

Conversions

As noted above, conversion system 22 changes the identity of each checked exception to an unchecked exception. Since this occurs after development of the application has completed, any changes would not adversely affect the development of the application when the checked exception list is required. This would be done in such a way as to have no effect on the program at runtime as well. In order to do this, classes which extend (subclass) Exception would instead be changed to extend RuntimeException. This would have no adverse effect on the program as long as it is ensured that the exception handling of the program would not change, and that it ensured that any type checking within the program would not change.

For handlers that catch java.lang.Exception, no changes would be required as all exceptions, including all Runtime-Exceptions, would continue to be caught. In the case where the optimization system 18 was integrated with the compiler 32, the compiler 32 may complain that there are no longer any checked exceptions that can be caught (after the optimization has taken place) and thus catching exceptions is inappropriate. To handle this case, the handler could be changed to catch java.lang.RuntimeException. The handler would also have additional checks to ensure that it rethrows any exceptions now being caught that would not have been caught otherwise, had the optimization not taken place.

For handlers that catch java.lang.RuntimeException, some modifications may be required, as some of these handlers would start catching exceptions that were not caught before. In such circumstances, exceptions that had been caught would be rethrown, except for those exceptions which would otherwise have been caught by another handler. In such cases, the handlers would be re-ordered so that the handler for RuntimeException is not longer the handler that catches the migrated exceptions.

The following pseudo-code describes the process:

```
for each class
    for each method in class
        get exception list
        for each exception in list
            if checked exception then attempt optimization
        end for
    end for
end for
```

Figure 3:
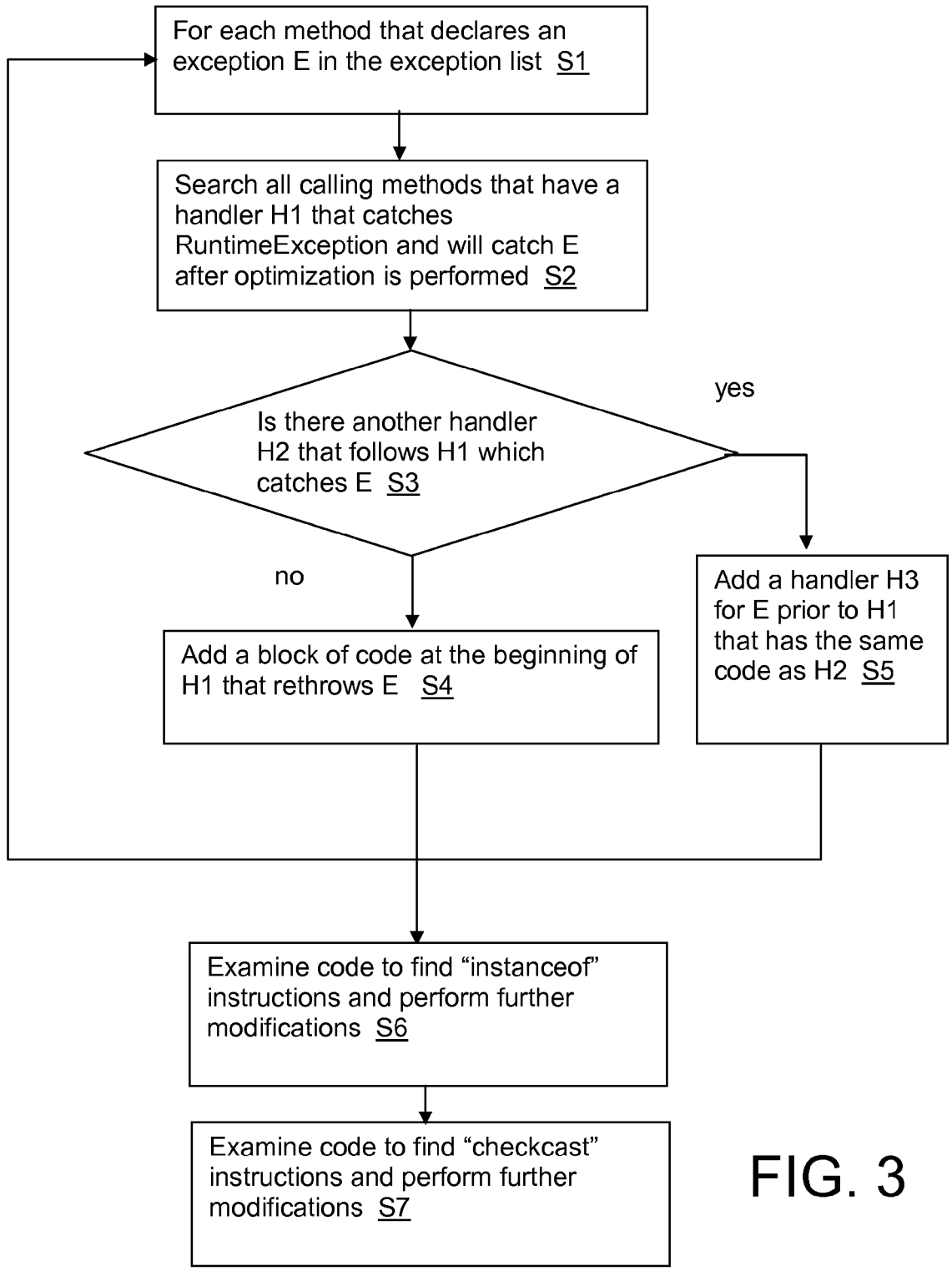
FIG. 3 depicts a flow diagram showing an optimization for converting checked exceptions to unchecked exceptions in accordance with an embodiment of the present invention.

FIG. 3 depicts a flow diagram showing an illustrative overview of how the optimization may be implemented. For each method that declares the exception E in its exception list (S1), search for all calling methods that have a handler H1 that catches RuntimeException and will catch E after the optimization is performed (S2). Check to see if there is another handler H2 that follows H1 that will catch E (S3). If no, add a block of code at the beginning of H1 that rethrows E (S4), since the handler is not meant to catch E. If yes, add a handler H3 for E prior to H1 that has the same code as H2 (S5).

Next, methods that have type checks (i.e., "instanceof" instructions) for RuntimeException or Exception need special handling (S6). If there is a type check for RuntimeException anywhere in the code for the entire program, then a flow analysis is performed to determine whether an object of type E can arrive at that location, whether it be from an argument, a return value, or a caught exception, using an intra-method analysis. If it is possible that the argument to the type check can be an object of type E, then:

Option a: add another type check for E, integrated with the original type check, so that the overall result of the type checking does not change; or Option b: abandon the optimization for E, if the additional code will undo any savings obtained from removing E from exception declaration lists.

At S7, if there is a cast into RuntimeException anywhere in the code (i.e., a "checkcast" instruction), then a flow analysis should be done to determine whether an object of type E can arrive at that location, whether it be from an argument, a return value, or a caught exception, using an intra-method analysis. If it is possible that the argument to the type check can be an object of type E, then:

Option a: do an instanceof check for type E prior to the cast. If the instanceof check is true, then throw a ClassCastException, so that the behaviour of the code has not changed.

Option b: abandon the optimization for E, if the additional code will undo any savings obtained from removing E from exception declaration lists.

List Removal

List removal system 24 removes the exception lists without changing checked exceptions to unchecked exceptions. Since the exception lists are only used at compile time, removing the lists has no effect. However, classes which are altered in this way would no longer satisfy the requirements of the Java language specification. If this is a requirement, then conversion system 22 would provide a better optimization choice. If Java adherence is not a requirement, then this choice is the simplest solution and also the most effective considering that no changes to the code are required. A java virtual machine does not need the presence of the exception list to operate effectively, since the sole function of the list is to warn callers about checked exceptions that must be handled, when the program is compiled.

The Java VM specification states in section 4.7.4:

A method should throw an exception only if at least one of the following three criteria is met:

1. The exception is an instance of RuntimeException or one of its subclasses.
2. The exception is an instance of Error or one of its subclasses.
3. The exception is an instance of one of the exception classes specified in the exception_index_table just described, or one of their subclasses.

These requirements are not enforced in the Java virtual machine; they are enforced only at compile time.

Pseudo code for implementing list removal system 24 is as follows:

```
for each class
    for each method in class
        remove exception list
    end for
end for
```

Figure 2:
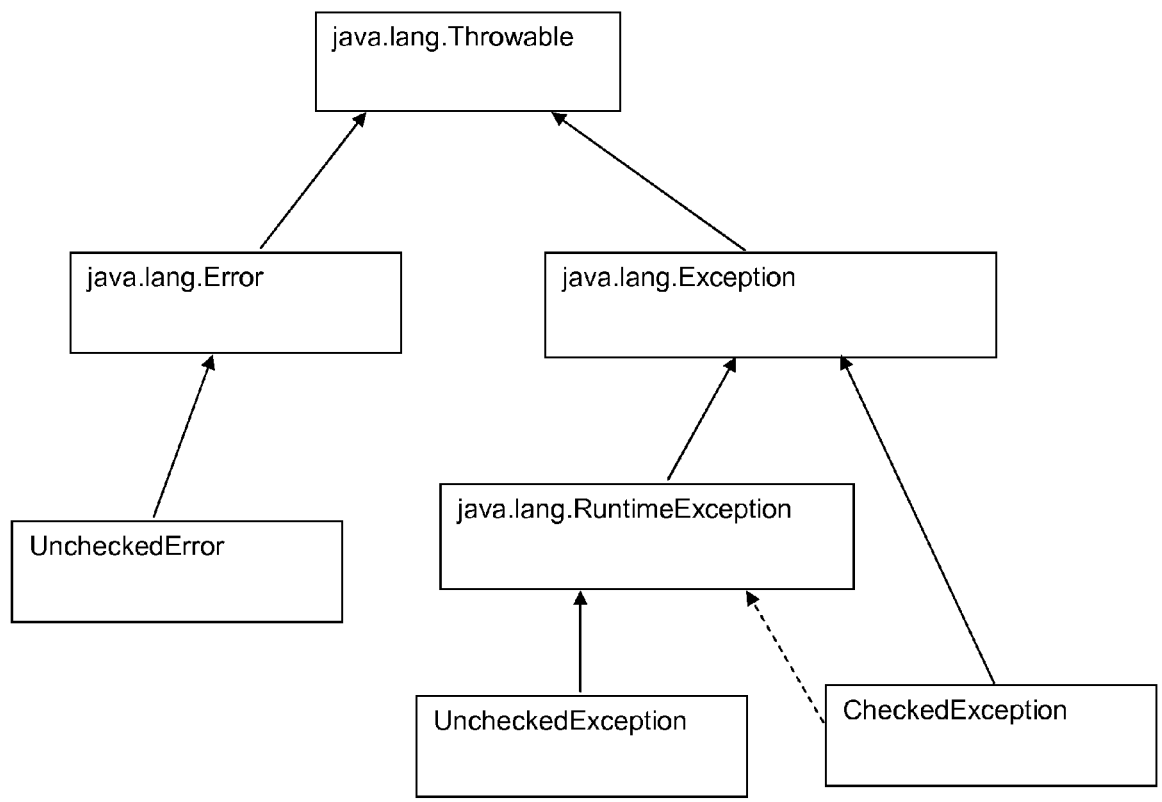
FIG. 2 depicts a class hierarchy in accordance with an embodiment of the present invention.

FIG. 2 depicts a class hierarchy demonstrating those exceptions that are checked and unchecked for the java language. All exceptions are derived from the java.lang.Throwable class, which has a first subclass java.lang.Error representing unrecoverable errors, and which can have any further subclass such as UncheckedError, representing a specific unrecoverable error that is not a checked exception. The java.lang.Exception subclass represents recoverable exceptions, either caught or propagated to callers. The subclass java.lang.RuntimeException represents unchecked exceptions for conditions that are unexpected but can be handled (are recoverable). Checked exceptions are all those exceptions which derive from the java.lang.Exception class and not the java.lang.RuntimeException class, e.g., java.io.IOException. The dotted line illustrates the change required to implement a conversion, namely changing an exception to subclass RuntimeException, rather than subclassing Exception directly.

Referring again to FIG. 1, it is understood that computer system 10 may be implemented as any type of computing infrastructure. Computer system 10 generally includes a processor 12, input/output (I/O) 14, memory 16, and bus 17. The processor 12 may comprise a single processing unit, or be distributed across one or more processing units in one or more locations, e.g., on a client and server. Memory 16 may comprise any known type of data storage, including magnetic media, optical media, random access memory (RAM), read-only memory (ROM), a data cache, a data object, etc. Moreover, memory 16 may reside at a single physical location, comprising one or more types of data storage, or be distributed across a plurality of physical systems in various forms.

I/O 14 may comprise any system for exchanging information to/from an external resource. External devices/resources may comprise any known type of external device, including a monitor/display, speakers, storage, another computer system, a handheld device, keyboard, mouse, voice recognition system, speech output system, printer, facsimile, pager, etc. Bus 17 provides a communication link between each of the components in the computer system 10 and likewise may comprise any known type of transmission link, including electrical, optical, wireless, etc. Although not shown, additional components, such as cache memory, communication systems, system software, etc., may be incorporated into computer system 10.

Access to computer system 10 may be provided over a network such as the Internet, a local area network (LAN), a wide area network (WAN), a virtual private network (VPN), etc. Communication could occur via a direct hardwired connection (e.g., serial port), or via an addressable connection that may utilize any combination of wireline and/or wireless transmission methods. Moreover, conventional network connectivity, such as Token Ring, Ethernet, WiFi or other conventional communications standards could be used. Still yet, connectivity could be provided by conventional TCP/IP sockets-based protocol. In this instance, an Internet service provider could be used to establish interconnectivity. Further, as indicated above, communication could occur in a client-server or server-server environment.

It should be appreciated that the teachings of the present invention could be offered as a business method on a subscription or fee basis. For example, a computer system 10 comprising an optimization system 18 could be created, maintained and/or deployed by a service provider that offers the functions described herein for customers. That is, a service provider could offer to deploy or provide the ability to process compiled Java code 30 as described above.

It is understood that in addition to being implemented as a system and method, the features may be provided as a program product stored on a computer-readable medium, which when executed, enables computer system 10 to provide an optimization system 18. To this extent, the computer-readable medium may include program code, which implements the processes and systems described herein. It is understood that the term "computer-readable medium" comprises one or more of any type of physical embodiment of the program code. In particular, the computer-readable medium can comprise program code embodied on one or more portable storage articles of manufacture (e.g., a compact disc, a magnetic disk, a tape, etc.), on one or more data storage portions of a computing device, such as memory 16 and/or a storage system.

As used herein, it is understood that the terms "program code" and "computer program code" are synonymous and mean any expression, in any language, code or notation, of a set of instructions that cause a computing device having an information processing capability to perform a particular function either directly or after any combination of the following: (a) conversion to another language, code or notation; (b) reproduction in a different material form; and/or (c) decompression. To this extent, program code can be embodied as one or more types of program products, such as an application/software program, component software/a library of functions, an operating system, a basic I/O system/driver for a particular computing and/or I/O device, and the like. Further, it is understood that terms such as "component" and "system" are synonymous as used herein and represent any combination of hardware and/or software capable of performing some function(s).

The block diagrams in the figures illustrate the architecture, functionality, and operation of possible implementations of systems, methods and computer program products according to various embodiments of the present invention. In this regard, each block in the block diagrams may represent a module, segment, or portion of code, which comprises one or more executable instructions for implementing the specified logical function(s). It should also be noted that the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams can be implemented by special purpose hardware-based systems which perform the specified functions or acts, or combinations of special purpose hardware and computer instructions.

Although specific embodiments have been illustrated and described herein, those of ordinary skill in the art appreciate that any arrangement which is calculated to achieve the same purpose may be substituted for the specific embodiments shown and that the invention has other applications in other environments. This application is intended to cover any adaptations or variations of the present invention. The following claims are in no way intended to limit the scope of the invention to the specific embodiments described herein.

What is claimed is:

1. A system for optimizing already compiled Java code to reduce file size, comprising:
    a computing device that comprises:
        a first optimization that removes exception declarations including subtypes of the declarations in bytecode already compiled by a Java code compiler;
        a second optimization that converts checked exception declarations to unchecked exception declarations in bytecode already compiled by a Java code compiler, wherein the second optimization:
        identifies each method that declares a checked exception E and searches all calling methods that have a handler H1 that catches RuntimeException and will catch E;
        determines if there is another handler H2 that follows H1 which catches E;
        if yes, adds another handler H3 for E prior to H1, wherein H3 has the same code as H2; and
        if no, adds a block of code at the beginning of H1 that rethrows E; and
    a processor and a memory to store instructions to be executed on the processor, wherein the processor and the memory are accessible by the computing device.

2. The system of claim 1, wherein the first optimization removes redundant entries in a list of checked exceptions, the list of checked exceptions resident in one or more already compiled Java class files.

3. The system of claim 2, wherein the first optimization removes subtypes of another exception in the list of checked exceptions.

4. The system of claim 3, wherein the first optimization removes exceptions in the list of exceptions that are not checked exceptions.

5. The system of claim 1, wherein the second optimization examines the Java code to find instanceof instructions, and modifying the code so that the behavior of the code does not change.

6. The system of claim 5, wherein the second optimization examines the Java code to find checkcast instructions, and modifying the code so that the behavior of the code does not change.

7. A method for optimizing already compiled Java code to reduce file size, comprising:
converting checked exception declarations to unchecked exception declarations in already compiled Java class files; and
removing exception lists in already compiled Java class files,
wherein converting checked exception declarations to unchecked exception declarations includes:
identifying each method that declares a checked exception E and searching all calling methods that have a handler H1 that catches RuntimeException and will catch E;
determining if there is another handler H2 that follows H1 which catches E;
if yes, adds another handler H3 for E prior to H1, wherein H3 has the same code as H2; and
if no, adds a block of code at the beginning of H1 that rethrows E.

8. The method of claim 7 further comprising removing unnecessary exception declarations including subtypes of the declarations in the compiled Java code, wherein removing unnecessary exception declarations removes redundant entries in a list of checked exceptions.

9. The method of claim 8, wherein removing unnecessary exception declarations removes subtypes of another exception in the list of checked exceptions.

10. The method of claim 9, wherein removing unnecessary exception declarations removes exceptions in the list of exceptions that are not checked exceptions.

11. The method of claim 7, further including examining the Java code to find instanceof instructions, and modifying the code so that the behavior of the code does not change.

12. The method of claim 11, further including examining the Java code to find checkcast instructions, and modifying the code so that the behavior of the code does not change.

13. A non-transitory computer readable medium having a program product stored thereon for optimizing already compiled Java code to reduce file size, comprising:
program code that removes exception declarations including subtypes of the declarations in already compiled Java code;
and
program code that removes exception lists from already compiled Java code,
wherein the program code that removes checked exception declarations includes:
code for identifying each method that declares a checked exception E and searching all calling methods that have a handler H1 that catches RuntimeException and will catch E;
code for determining if there is another handler H2 that follows H1 which catches E;
if yes, adds another handler H3 for E prior to H1, wherein H3 has the same code as H2; and
if no, adds a block of code at the beginning of H1 that rethrows E.

14. The non-transitory computer readable medium of claim 13, wherein the program code that removes exception declarations removes redundant entries in a list of checked exceptions and wherein the redundant entries are removed prior to deployment of the already compiled Java code to a platform or device that will run the compiled Java code.

15. The non-transitory computer readable medium of claim 14, wherein the program code that removes exception declarations removes subtypes of another exception in the list of checked exceptions.

16. The non-transitory computer readable medium of claim 13, further including program code that converts checked exception declarations to unchecked exception declarations in the compiled Java code; and program code for examining the already compiled Java code to find instanceof instructions.

17. The non-transitory computer readable medium of claim 13, further including program code for examining the already compiled Java code to find checkcast instructions.

* * * * *